US009800205B2

United States Patent
Li et al.

(10) Patent No.: US 9,800,205 B2
(45) Date of Patent: Oct. 24, 2017

(54) POWER AMPLIFIER CIRCUIT

(71) Applicant: INDUSTRIAL TECHNOLOGY RESEARCH INSTITUTE, Hsinchu (TW)

(72) Inventors: Wei-Tsung Li, New Taipei (TW); Shih-Ming Wang, Hsinchu (TW); Chih-Chun Shen, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/366,508

(22) Filed: Dec. 1, 2016

(65) Prior Publication Data

US 2017/0163216 A1    Jun. 8, 2017

Related U.S. Application Data

(60) Provisional application No. 62/262,931, filed on Dec. 4, 2015.

(30) Foreign Application Priority Data

Nov. 7, 2016    (TW) .............................. 105136144 A

(51) Int. Cl.
*H03F 3/19*    (2006.01)
*H03F 1/02*    (2006.01)
(Continued)

(52) U.S. Cl.
CPC ............ *H03F 1/0205* (2013.01); *H03F 1/52* (2013.01); *H03F 3/19* (2013.01); *H03F 3/245* (2013.01);
(Continued)

(58) Field of Classification Search
CPC ................................ H03F 1/0205; H03F 3/19
See application file for complete search history.

(56) References Cited

U.S. PATENT DOCUMENTS 4,236,048 A * 11/1980 Olney ................... H04M 1/585
379/391
6,404,287 B2    6/2002 Dening et al.
(Continued)

FOREIGN PATENT DOCUMENTS

| TW | I299939 B | 8/2008 |
| TW | 201534050 A | 9/2015 |

OTHER PUBLICATIONS

Kim et al., "MMIC Power Amplifier Adaptively Linearized With RF Coupled Active Bias Circuit for W-CDMA Mobile Terminals Applications", 2003 IEEE MTT-S Digest, pp. 2209-2212.
(Continued)

*Primary Examiner* — Patricia T Nguyen
(74) *Attorney, Agent, or Firm* — Birch, Stewart, Kolasch & Birch, LLP

(57) ABSTRACT

A power amplifier circuit including a power transistor, a variable impedance circuit, first and second envelope detecting circuits is provided. The power transistor receives an input signal and outputs an output signal. The variable impedance circuit includes an impedance control transistor and a first filter capacitor. An equivalent impedance of the variable impedance circuit varies with the input signal. The impedance control transistor is coupled to the power transistor and receives a control voltage. The first filter capacitor is coupled between the impedance control transistor and ground. Both the first and the second envelope detecting circuits detect the input signal to dynamically control the equivalent impedance of the variable impedance circuit.

23 Claims, 14 Drawing Sheets

(51) Int. Cl.
*H03F 3/24* (2006.01)
*H03F 1/52* (2006.01)

(52) U.S. Cl.
CPC .. *H03F 2200/102* (2013.01); *H03F 2200/105* (2013.01); *H03F 2200/129* (2013.01); *H03F 2200/165* (2013.01); *H03F 2200/222* (2013.01); *H03F 2200/387* (2013.01); *H03F 2200/451* (2013.01); *H03F 2200/78* (2013.01)

(56) References Cited

U.S. PATENT DOCUMENTS

| | | |
|---|---|---|
| 6,791,418 B2 | 9/2004 | Luo et al. |
| 6,831,517 B1 | 12/2004 | Hedberg et al. |
| 6,859,103 B2 | 2/2005 | Yeh |
| 7,057,461 B1 | 6/2006 | Canilao et al. |
| 7,504,887 B2 | 3/2009 | Masuda et al. |
| 7,564,311 B2 | 7/2009 | Rohani et al. |
| 7,729,672 B2 | 6/2010 | Deng et al. |
| 8,106,712 B2 | 1/2012 | Lee et al. |
| 8,150,343 B2 | 4/2012 | Ramachandra Reddy |
| 8,466,744 B2 | 6/2013 | Salomie |
| 2004/0198271 A1* | 10/2004 | Kang ............... H03F 1/086 455/127.1 |
| 2006/0238245 A1* | 10/2006 | Carichner ......... H03F 1/0205 330/136 |
| 2007/0249304 A1* | 10/2007 | Snelgrove ......... H03F 1/0205 455/127.2 |
| 2011/0090011 A1 | 4/2011 | Chang et al. |
| 2011/0279179 A1* | 11/2011 | Vice ............... H03G 3/007 330/127 |
| 2013/0200865 A1* | 8/2013 | Wimpenny ......... H02M 1/08 323/271 |
| 2015/0162877 A1 | 6/2015 | Ni |
| 2016/0036386 A1 | 2/2016 | Morshedi et al. |

OTHER PUBLICATIONS

Liu et al., "A K-Band Power Amplifier with Adaptive Bias in 90-nm CMOS", Proceedings of the 44th European Microwave Conference, Oct. 6-9, 2014, pp. 1376-1379.

Noh et al., "PCS/W-CDMA Dual-Band MMIC Power Amplifier With a Newly Proposed Linearizing Bias Circuit", IEEE Journal of Solid-State Circuits, vol. 37, No, 9, Sep. 2002, pp. 1096-1099.

Unknown Author, "A 2.5 to 2.7 GHz Broadband GaAs RFIC Power Amplifier for LTE Small-cell Applications", Unknown Publication Source, 3 pages.

Yang et al., "5-GHz. Band SiGe HBT Linear Power Amplifier IC With Novel CMOS Active Bias Circuit for WLAN Applications", Proceedings of the 44th European Microwave Conference, Oct. 6-9, 2014, pp. 1372-1375.

Yeh et al., "A 1.8-V Monolithic SIGE HBT Power Amplifier With a Novel Proposed Linearizing Bias Circuit", The 2004 IEEE Asia-Pacific Conference on Circuits and Systems, Dec. 6-9, 2004, pp. 305-308.

Yoshimasu et al., "An HBT MMIC Power Amplifier with an Integrated Diode Linearizer for Low-Voltage Portable Phone Applications", IEEE Journal of Solid-State Circuits, vol. 33, No. 9, Sep. 1998, pp. 1290-1296.

* cited by examiner

POWER AMPLIFIER CIRCUIT

This application claims the benefit of U.S. provisional patent application No. 62/262,931 filed on Dec. 4, 2015 and Taiwan patent application Serial No. 105136144, filed on Nov. 7, 2016, the subject matters of which are incorporated herein by reference.

TECHNICAL FIELD

The invention relates in general to a power amplifier circuit.

BACKGROUND

In a wireless communication system, the power amplifier of a wireless transmitter amplifies a radio frequency signal (also referred as a high-frequency signal or a microwave signal) to a high power level, and transmits the amplified radio frequency signal to a wireless receiver through an antenna and a transmission medium (such as air).

The power amplifier is used in many fields, such as entertainment (remote control vehicle, unmanned aerial vehicle, air shot machine), global system for mobile communications (GSM), wideband code division multiple access (W-CDMA), long term evolution (LTE), wireless local area network (WLAN), military applications and space applications. In terms of power consumption, the power amplifier ranks number one or number two in the wireless communication system. In the wireless communication system, the power amplifier may have poor linearity, and may cause distortion or even jeopardize the quality and accuracy of signal communication.

During signal amplifying performed by the power amplifier, the third-order distorted signals near the main signal may deteriorate the quality of communication signals. FIG. 1 is a schematic diagram showing signal distortion. As indicated in the left-hand diagram of FIG. 1, if the main frequencies used by two users are far from each other, no or little interference will occur between the two main frequencies. As indicated in the right-hand diagram of FIG. 1, if the frequencies used by the two users are close to each other, the third-order distorted signals will interfere with each other and deteriorate the communication quality.

To maintain communication quality, to smoothly demodulate the signals at the receiver and to prevent interference on other users during signal transmission, signal transmission standards for the transmitter are defined. Adjacent channel leakage ratio (ACLR) may be used to measure the spectrum interference on users outside the channel when the communication signals are distorted. At a frequency away from the center frequency, the spectrum of the transmitter is required to be lower than a spectral mask. Thus, the power amplifier of the transmitter is required to have high linearity to prevent the spectral regrowth and to prevent the signal interference from adjacent channels.

SUMMARY

According to one embodiment of the disclosure, a power amplifier circuit is provided. The power amplifier circuit includes a power transistor, a variable impedance circuit, a first envelope detecting circuit and a second envelope detecting circuit. The power transistor receives an input signal and outputs an output signal. The variable impedance circuit is coupled to the power transistor and includes an impedance control transistor, a first filter capacitor and a compensation resistor, wherein the compensation resistor has a first terminal coupled to the power transistor and a second terminal coupled to a first terminal of the impedance control transistor; the impedance control transistor has a first terminal coupled to the second terminal of the compensation resistor, a second terminal coupled to the first filter capacitor, and a third terminal receiving a first control voltage; the first filter capacitor is coupled between the second terminal of the impedance control transistor and a ground. The first envelope detecting circuit is coupled to the input signal and the variable impedance circuit and includes a second filter capacitor coupled to the input signal and a filter inductor coupled between the second terminal of the impedance control transistor and the second filter capacitor. The second envelope detecting circuit is coupled to the input signal and the variable impedance circuit and includes a protection resistor and an input-signal-amplifying transistor, wherein the input-signal-amplifying transistor has a first terminal coupled to the ground, a second terminal coupled to the protection resistor, and a third terminal coupled to the second terminal of the impedance control transistor; the protection resistor is coupled between the input signal and the second terminal of the input-signal-amplifying transistor.

According to another embodiment of the disclosure, a power amplifier circuit is provided. The power amplifier circuit includes a power transistor, a variable impedance circuit, a first envelope detecting circuit and a second envelope detecting circuit. The power transistor receives an input signal and outputs an output signal. The variable impedance circuit is coupled to the power transistor and includes an impedance control transistor and a first filter capacitor. An equivalent impedance of the variable impedance circuit varies with the input signal. The impedance control transistor has a first terminal coupled to the power transistor, a second terminal coupled to the first filter capacitor, and a third terminal receiving a first control voltage. The first filter capacitor is coupled between the second terminal of the impedance control transistor and a ground.

According to an alternate embodiment of the disclosure, a power amplifier circuit is provided. The power amplifier circuit includes a power transistor, a variable impedance circuit, a first envelope detecting circuit, a second envelope detecting circuit, and a control circuit. The power transistor receives an input signal and outputs an output signal. The variable impedance circuit is coupled to the power transistor and includes an impedance control transistor and a first filter capacitor. An equivalent impedance of the variable impedance circuit varies with the input signal. The impedance control transistor has a first terminal coupled to the power transistor, a second terminal coupled to the first filter capacitor, and a third terminal receiving a first control voltage. The first filter capacitor is coupled between the second terminal of the impedance control transistor and a ground. The first envelope detecting circuit is coupled to the input signal and the variable impedance circuit for detecting the input signal to dynamically control the equivalent impedance of the variable impedance circuit. The first envelope detecting circuit includes a filter unit for fetching and providing the input signal to the second terminal of the impedance control transistor of the variable impedance circuit. The second envelope detecting circuit is coupled to the input signal and the variable impedance circuit for detecting the input signal to dynamically control the equivalent impedance of the variable impedance circuit. The second envelope detecting circuit is for amplifying and feeding the input signal into the second terminal of the impedance control transistor. The control circuit is coupled to the variable impedance circuit for controlling the variable impedance circuit to provide a current to the power transistor.

Figure 1:
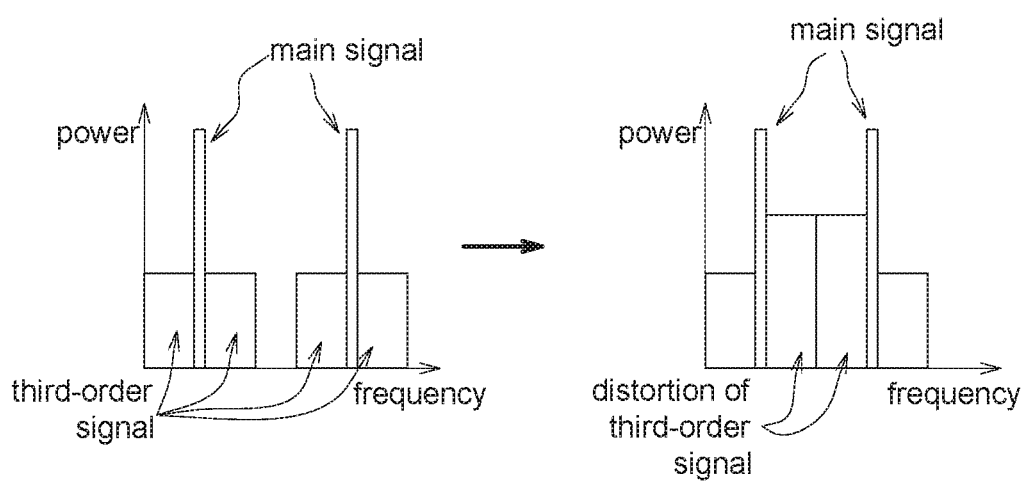
FIG. 1 is a schematic diagram showing signal distortion.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 2:
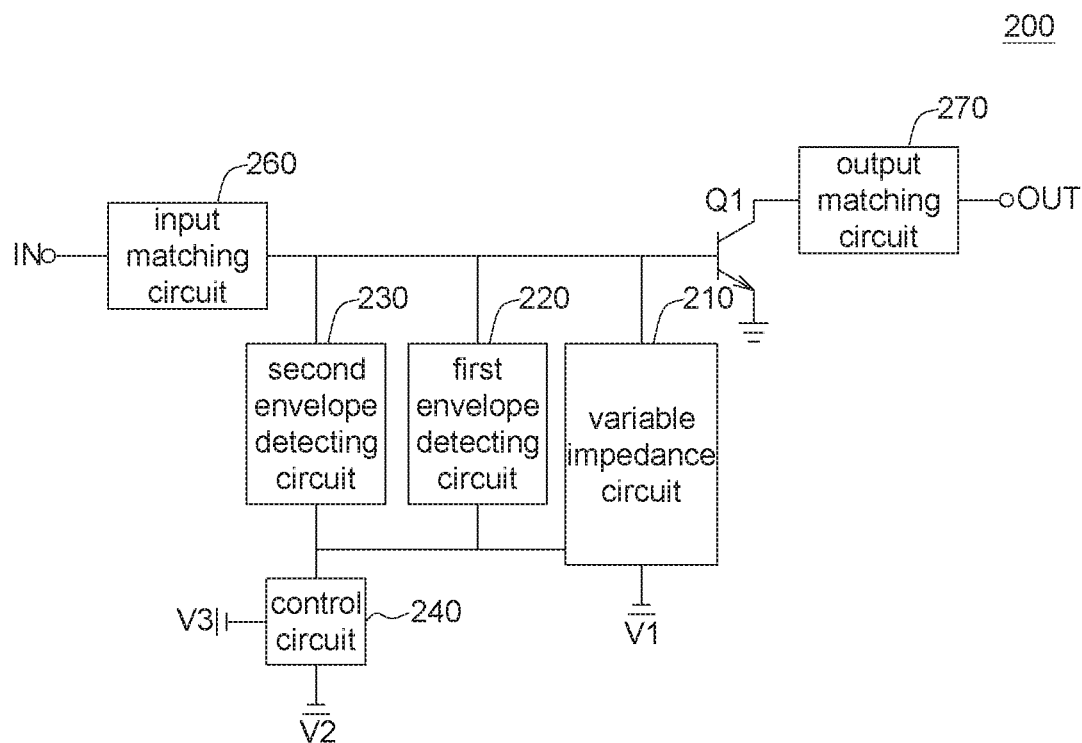
FIG. 2 is a functional block diagram of a power amplifier circuit according to an embodiment of the disclosure.

Referring to FIG. 2, a functional block diagram of a power amplifier circuit according to an embodiment of the disclosure is shown. As indicated in FIG. 2, the power amplifier circuit 200 according to an embodiment of the disclosure includes a variable impedance circuit 210, a first envelope detecting circuit 220, a second envelope detecting circuit 230, a control circuit 240 and a power transistor Q1. The power amplifier circuit 200 according to an embodiment of the disclosure further selectively includes an input matching circuit 260 and an output matching circuit 270. The variable impedance circuit 210, the first envelope detecting circuit 220, the second envelope detecting circuit 230, and the control circuit 240 may form a dynamic bias circuit.

The equivalent impedance of the variable impedance circuit 210 may be increased according to the increase in the power of the input signal IN. When the power of the input signal IN is small, the variable impedance circuit 210 has low impedance. When the power of the input signal IN is high, the variable impedance circuit 210 has high impedance. Details of the variable impedance circuit 210 are disclosed below. Because of the variable impedance circuit 210, the dynamic bias circuit according to an embodiment of the disclosure has gain expansion and phase compression for compensating the gain compression and phase expansion of the power transistor and for improving the linearity of the power amplifier circuit.

The first envelope detecting circuit 220 and the second envelope detecting circuit 230 detect the phase and amplitude of the input signal IN to dynamically control the impedance of the variable impedance circuit 210. When the input signal IN is a small signal, the second envelope detecting circuit 230 amplifies and feeds the input signal IN into the variable impedance circuit 210, so that the variable impedance circuit 210 provides a sufficient current to the power transistor Q1. When the input signal IN is a large signal, it is difficult for the variable impedance circuit 210 to provide a sufficient current to the power transistor Q1 if operating by the second envelope detecting circuit 230 alone. Therefore, when the input signal IN is a large signal, the first envelope detecting circuit 220 fetches and provides the input signal IN to the variable impedance circuit 210, so that the variable impedance circuit 210 provides a sufficient current to the power transistor Q1. Details of the first envelope detecting circuit 220 and the second envelope detecting circuit 230 are disclosed below. Through the first envelope detecting circuit 220 and the second envelope detecting circuit 230, the power amplifier circuit 200 according to an embodiment of the disclosure is more sensitive to the power level of the input signal IN.

The control circuit 240 controls the variable impedance circuit 210 to provide a current to the power transistor Q1. When the power amplifier circuit 200 according to an embodiment of the disclosure is at a high power mode, the control circuit 240 controls the variable impedance circuit 210 to provide a high current to the power transistor Q1. When the power amplifier circuit 200 according to an embodiment of the disclosure is at a low power mode, the control circuit 240 may control the variable impedance circuit 210 to provide a small current to the power transistor Q1. Thus, the static current and the power consumption of the power amplifier circuit 200 according to an embodiment of the disclosure may be reduced.

The power transistor Q1 may be realized by a bipolar junction transistor (BJT). The power transistor Q1 has three terminals. The first terminal (such as a base terminal) of the power transistor Q1 is coupled to the input signal IN and the variable impedance circuit 210. The second terminal (such as an emitter terminal) of the power transistor Q1 is coupled to ground (GND). The third terminal (such as a collector terminal) of the power transistor Q1 is coupled to the output signal OUT (for example, via direct connection or via the output matching circuit 270). If the power amplifier circuit 200 according to an embodiment of the disclosure is operated at a low power mode, the control circuit 240 may control the variable impedance circuit 210 to provide a low but sufficient current to the base of the power transistor Q1, such that the power transistor Q1 may have sufficient linearity, and the power consumption of the power amplifier circuit 200 may be reduced. In another embodiment, the power transistor Q1 may be realized by a field-effect transistor (FET) such as a metal-oxide-semiconductor field-effect transistor (MOSFET).

The input matching circuit 260 matches input impedance with the input signal IN. The output matching circuit 270 matches output impedance with the output signal OUT. Details of the architecture and operation of the input matching circuit 260 and the output matching circuit 270 are omitted here.

In another possible embodiment of the disclosure, the control circuit 240 is optional. Even without the control circuit, the power amplifier circuit according to an embodiment of the disclosure may still have high linearity and be sensitive to the power level of the input signal IN.

Figure 3A:
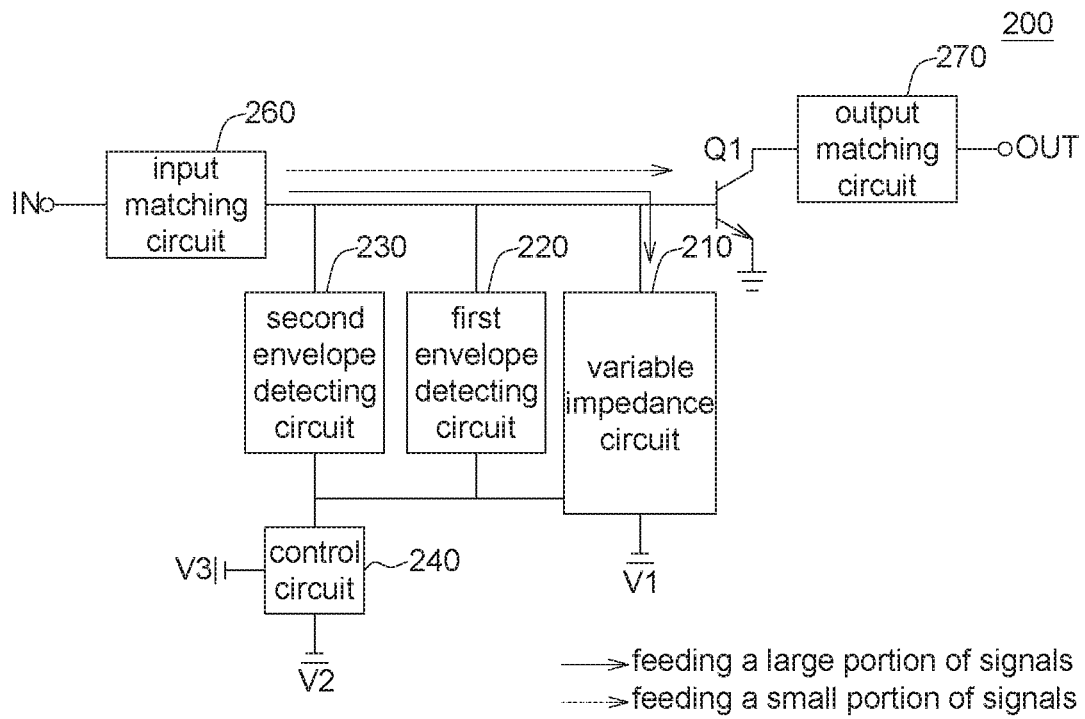
FIG. 3A and FIG. 3B are schematic diagrams of a power amplifier circuit when receiving a small signal and receiving a large signal, respectively, according to an embodiment of the disclosure.
Figure 3B:
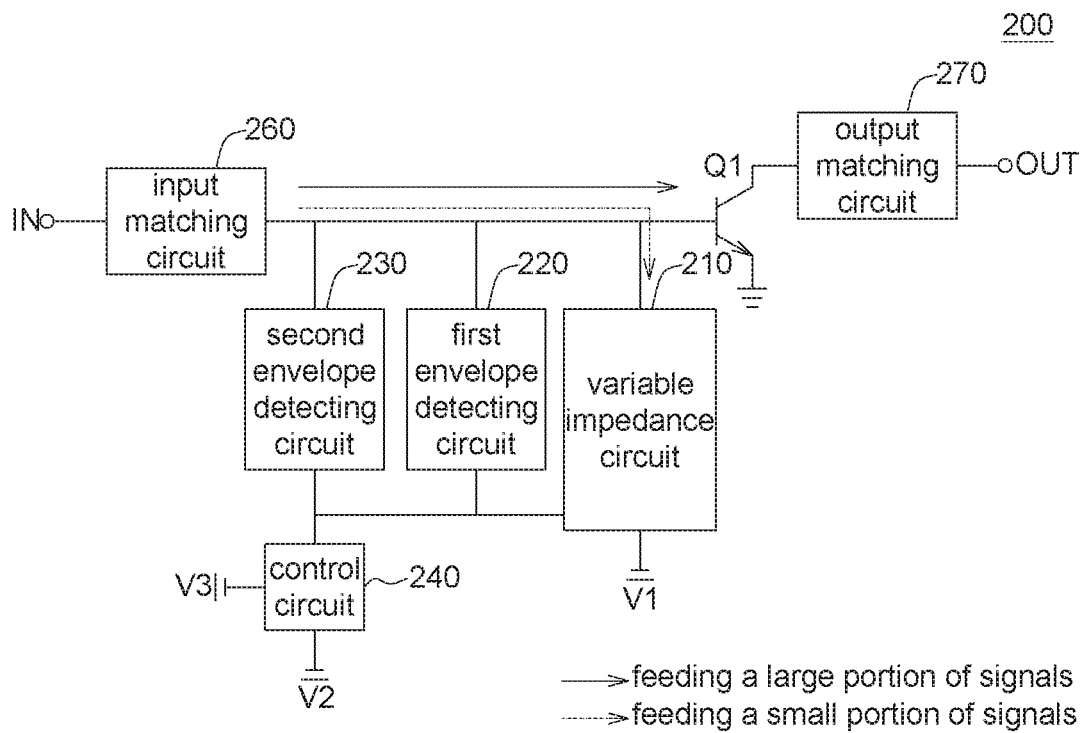

Referring to FIG. 3A and FIG. 3B, schematic diagrams of the power amplifier circuit 200 receiving a small signal and receiving a large signal, respectively, according to an embodiment of the disclosure are shown. As indicated in FIG. 3A, when the input signal IN is a small signal, a large portion of the input signal IN is fed to the variable impedance circuit 210, and a small portion of the input signal IN is fed to the power transistor Q1. Therefore, the power amplifier circuit 200 has a small gain. As indicated in FIG. 3B, when the input signal IN is a large signal, a small portion of the input signal IN is fed to the variable impedance circuit 210, and a large portion of the input signal IN is fed to the power transistor Q1. Therefore, the power amplifier circuit 200 has a high gain.

Figure 4:
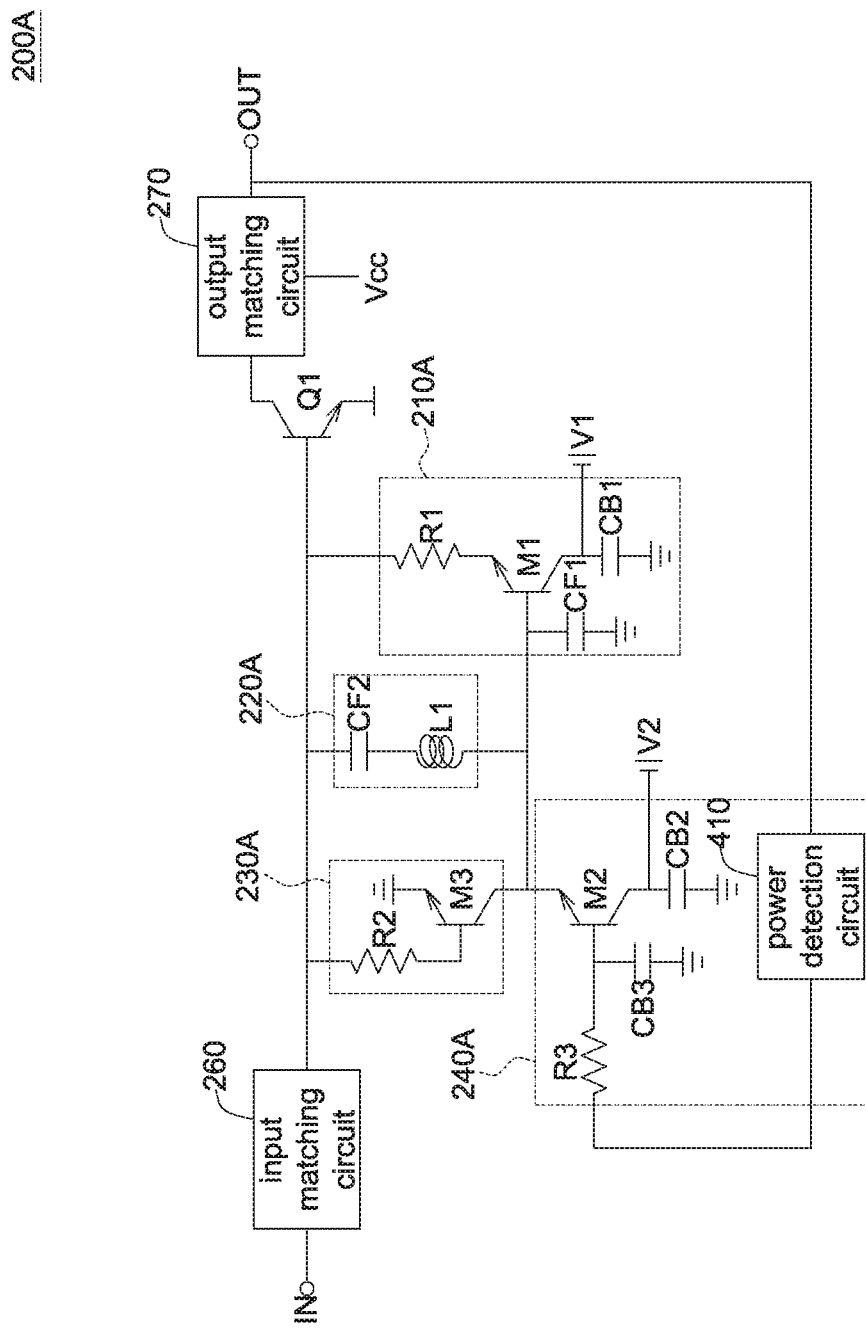
FIG. 4 is a circuit diagram of a power amplifier circuit according to an embodiment of the disclosure.

Referring to FIG. 4, a circuit diagram of a power amplifier circuit 200A according to an embodiment of the disclosure is shown. As indicated in FIG. 4, the variable impedance circuit 210A includes a resistor R1 (also referred as a compensation resistor), a transistor M1 (also referred as an impedance control transistor), a first filter capacitor CF1 and a first bypass capacitor CB1. The first envelope detecting circuit 220A includes an inductor L1 (also referred as a filter inductor) and a second filter capacitor CF2. The second envelope detecting circuit 230A includes a transistor M3 (also referred as an input-signal-amplifying transistor) and a resistor R2 (also referred as a protection resistor). The control circuit 240A includes a transistor M2 (also referred as a feedback control transistor), a second bypass capacitor CB2, a third bypass capacitor CB3, a resistor R3 (also referred as a feedback resistor) and a power detection circuit 410. The inductor L1 and the capacitors CB1~CB3 are optional. The transistor M1-M3 may be realized by bipolar junction transistors (BJT) or field-effect transistors (FET).

The resistor R1 is coupled between the power transistor Q1 and the transistor M1. The resistor R1 may compensate thermal effect of the power transistor Q1 (therefore, the resistor R1 may also be referred as the compensation resistor).

The transistor M1 has a base coupled to the envelope detecting circuits 220A and 230A and the control circuit 240A, an emitter coupled to the resistor R1, and a collector coupled to the first bypass capacitor CB1 and the control voltage V1. The first filter capacitor CF1 is coupled between the base of the transistor M1 and the ground for filtering the base current of the transistor M1. The first bypass capacitor CB1 is coupled between the collector of the transistor M1 and the ground.

The inductor L1 is coupled between the base of the transistor M1 and the second filter capacitor CF2. The second filter capacitor CF2 is coupled between the input terminal (for example, via direct connection or via the input matching circuit 260) and the inductor L1. The inductor L1 and the second filter capacitor CF2 may form a filter unit. The second filter capacitor CF2 may filter the input signal IN. Exemplarily but not restrictively, the inductor L1 and the second filter capacitor CF2 may fetch and feed the amplitude information and the phase information of the input signal IN to the variable impedance circuit 210A.

The transistor M3 has a base coupled to the input terminal (for example, via direct connection or via the resistor R2 and/or the input matching circuit 260), an emitter coupled to the ground, and a collector coupled to the base of the transistor M1.

The resistor R2 is coupled between the input terminal (for example, via direct connection or via the input matching circuit 260) and the base of the transistor M3. The resistor R2 may protect the transistor M3 (therefore, the resistor R2 may also be referred as the protection resistor) from being damaged by a large current.

When the input signal IN is a small signal, a portion of the input signal IN flows to the transistor M3 and the resistor R2 of the second envelope detecting circuit 230A to turn on the transistor M3. That is, the transistor M3 of the second envelope detecting circuit 230A amplifies and feeds the input signal IN (therefore. the transistor M3 may also be referred as the input-signal-amplifying transistor) into the base of the transistor M1, so that the transistor M1 may provide a sufficient current to the power transistor Q1. The transistor M1 is operated in a non-linear region.

When the input signal IN is a large signal, the input signal IN is amplified and provided to the transistor M1 by the transistor M3, and the input signal IN having a predetermined frequency is allowed to be input to the base of the transistor M1 through the inductor L1 and the second filter capacitor CF2 of the first envelope detecting circuit 220A, to increase the base voltage of the transistor M1 and to provide more current to the power transistor Q1.

The transistor M2 has a base coupled to the resistor R3, an emitter coupled to the base of the transistor M1, and a collector coupled to the second bypass capacitor CB2 and the control voltage V2. The second bypass capacitor CB2 is coupled between the collector of the transistor M2 and the ground. The third bypass capacitor CB3 is coupled between the base of the transistor M2 and the ground. The resistor R3 is coupled between the base of the transistor M2 and the power detection circuit 410.

As indicated in FIG. 4, the base voltage of the control transistor M2 is feedback controlled by the variable impedance circuit 210A, the first envelope detecting circuit 220A and the second envelope detecting circuit 230A, and the control circuit 240A, so that the power transistor Q1 has high output linearity and the current of the power transistor Q1 is adaptably controlled. In the present example, by selecting the control voltages V1 and V2 and by controlling the base voltage of the control transistor M2 via the power detection circuit 410, the transistors M1 and M2 are operated at the non-linear region. Besides, the input signal IN fed into the power transistor Q1 is dynamically sensed by serial connection of the second filter capacitor CF2 and the inductor L1 of the first envelope detecting circuit 220A and by serial connection of the resistor R2 and the transistor M3 of the second envelope detecting circuit 230A. Furthermore, by adaptably suppressing the current flowing through the transistor M3, the adjacent channel power ratio (ACPR) of the power transistor Q1 is improved when the power transistor Q1 outputs high output power signal.

When the transistor M2 is operated at a non-linear region, the transistor M2 functions as a switch circuit. After the power detection circuit 410 detects an output power of the power transistor Q1, the base voltage of the transistor M2 is dynamically feedback controlled, such that the power amplifier circuit is more sensitive to the input signal IN inputted to the power transistor Q1. When the power transistor Q1 is operated in a low power region, the transistor M1 provides a low static current. When the power transistor Q1 is operated in a high power region, the transistor M1 provides a sufficient dynamic current.

As indicated in FIG. 4, the memory effect of the power amplifier circuit according to an embodiment of the disclosure is improved via a proper inductance value of the inductor L1. The so called "memory effect" refers to the level of symmetry between two third-order distorted signals adjacent to the main signal. The lower the memory effect, the more symmetric the two third-order distorted signals.

Figure 5:
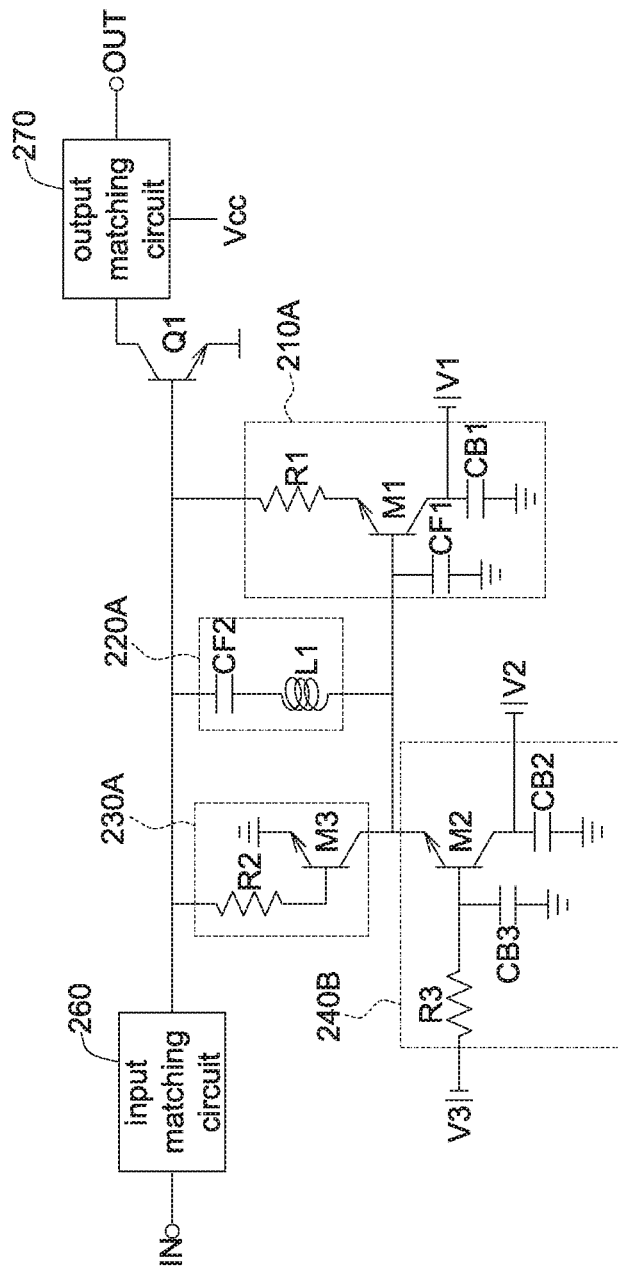
FIG. 5 is a circuit diagram of a power amplifier circuit according to an embodiment of the disclosure.

Referring to FIG. 5, a circuit diagram of a power amplifier circuit 200B according to an embodiment of the disclosure is shown. Different from FIG. 4, the control circuit 240B of the power amplifier circuit 200B of FIG. 5 does not include any power detection circuits. In the control circuit 240B, the other terminal of the resistor R3 is coupled to a control voltage V3.

The operation of the power amplifier circuit of FIG. 5 is similar to that of FIG. 4, and the details thereof are omitted here.

Figure 6:
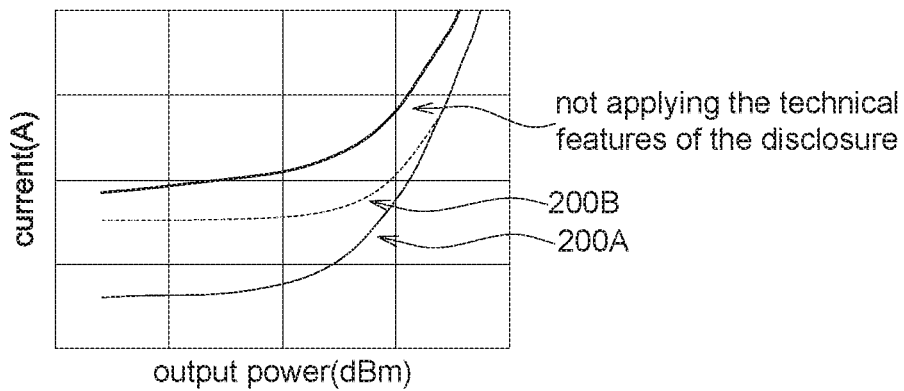
FIG. 6 is an efficiency comparison diagram between two embodiments of the disclosure (FIG. 4 and FIG. 5) and the technology not applying technical features of the disclosure.

Referring to FIG. 6, an efficiency comparison diagram between two embodiments of the disclosure (FIG. 4 and FIG. 5) and the technology not applying the technical features of the disclosure is shown. As indicated in FIG. 6, in a high power region and under the same linearity, the current consumption of the power amplifier circuit not applying the technical features of the disclosure is higher than that of the power amplifier circuit according to two embodiments of the disclosure (FIG. 4 and FIG. 5). When the power amplifier circuits are operated in a low power region, the static current of the power amplifier circuit (200B) in FIG. 5 is lower than that of the power amplifier circuit not applying the technical features of the disclosure, but the static current of the power amplifier circuit (200A) in FIG. 4 is lower than that of the power amplifier circuit (200B) in FIG. 5. As indicated in FIG. 6, under the same linearity, two embodiments of the disclosure improve the current consumption of the power amplifier circuit operated in a high power region, and the feedback control mechanism of the power detection circuit (such as the embodiment illustrated in FIG. 4) further reduces the static current of the power amplifier circuit when the power amplifier circuit is operated in a low power region.

Figure 7:
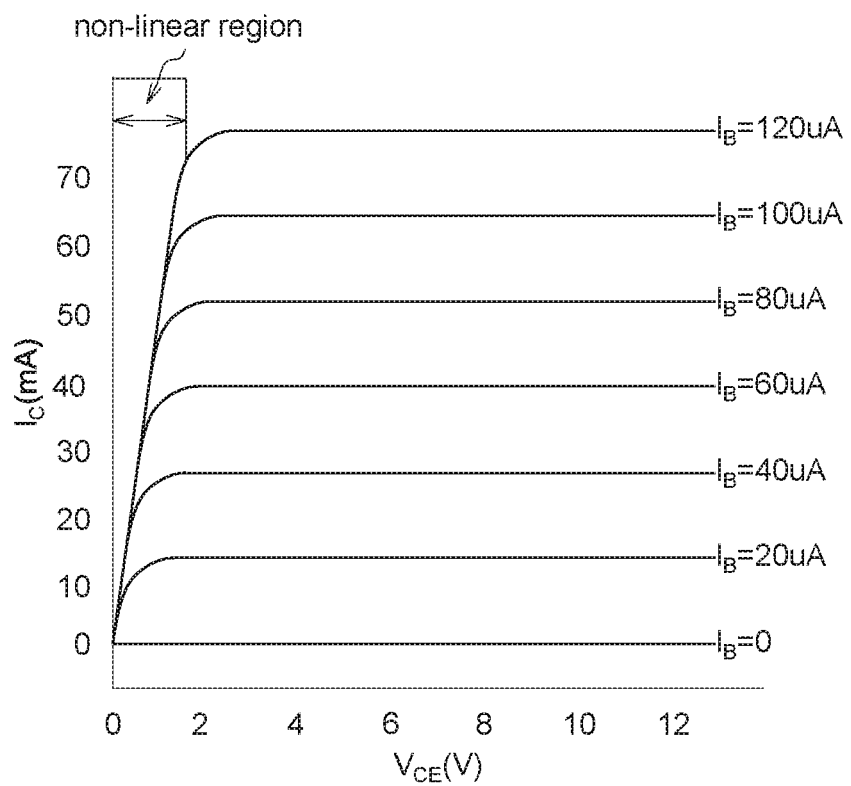
FIG. 7 is a voltage-current (V-I) curve diagram of a transistor according to an embodiment of the disclosure.

Referring to FIG. 7, a voltage-curve diagram (the voltage $V_{CE}$, the currents $I_C$ and $I_B$) of the transistor M1 according to an embodiment of the disclosure is shown. The voltage $V_{CE}$ denotes the voltage difference between the collector and the emitter of the transistor M1. The current $I_C$ denotes the collector current of the transistor M1. The current $I_B$ denotes the base current of the transistor M1. As indicated in FIG. 7, the transistor M1 according to an embodiment of the disclosure may be operated in a non-linear region, such that the equivalent impedance of the transistor M1 varies with the input signal IN. For example, the equivalent impedance of the transistor M1 increases as the input signal IN increases.

Figure 8A:
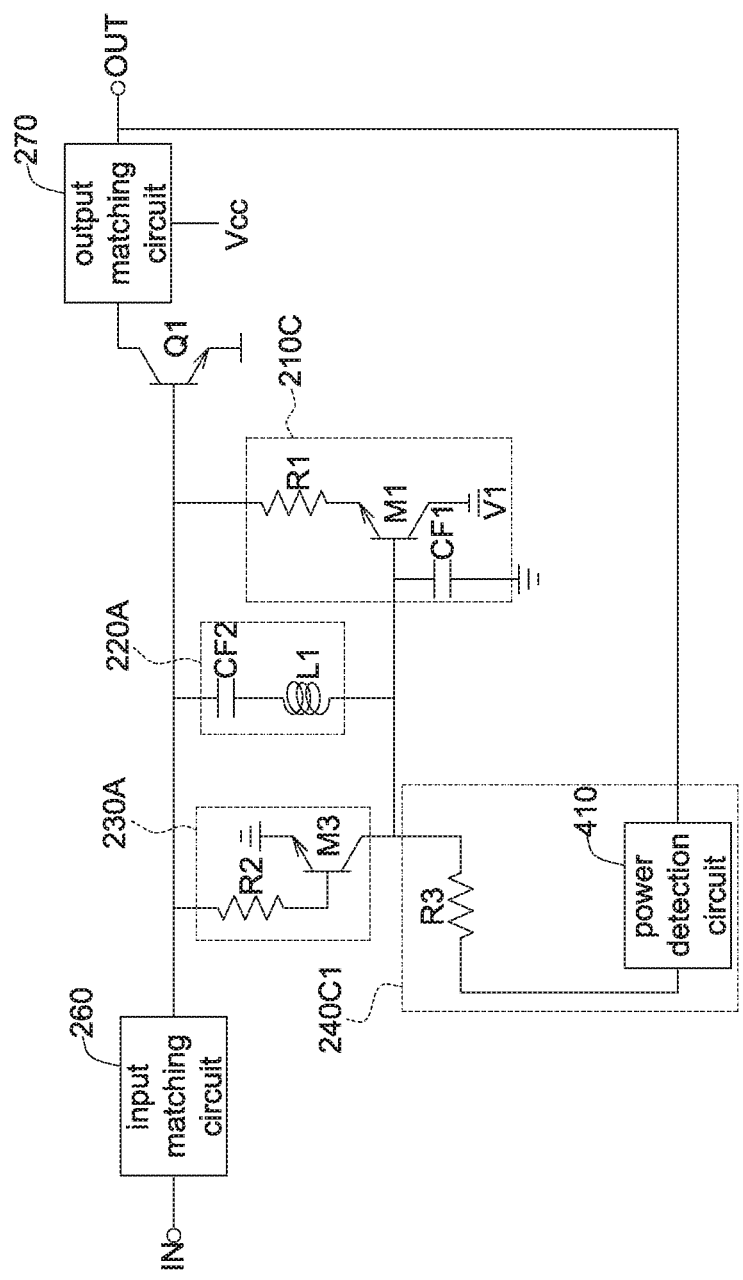
FIG. 8A and FIG. 8B are two circuit diagrams of power amplifier circuits according to two embodiments of the disclosure.

Referring to FIG. 8A, a circuit diagram of a power amplifier circuit 200C1 according to an embodiment of the disclosure is shown. As indicated in FIG. 8A, the variable impedance circuit 210C includes a resistor R1, a transistor M1, and a first filter capacitor CF1. The control circuit 240C1 includes a resistor R3 and a power detection circuit 410. The resistor R3 is coupled between the base of the transistor M1 and the power detection circuit 410. The operation of the power amplifier circuit of FIG. 8A is described below.

The power detection circuit 410 detects an output power of the power transistor Q1 and outputs a current to the resistor R3 to feedback control the base of the transistor M1. Detailed descriptions of the operations of other elements may be obtained with reference to above embodiments, and are not repeated here.

Figure 8B:
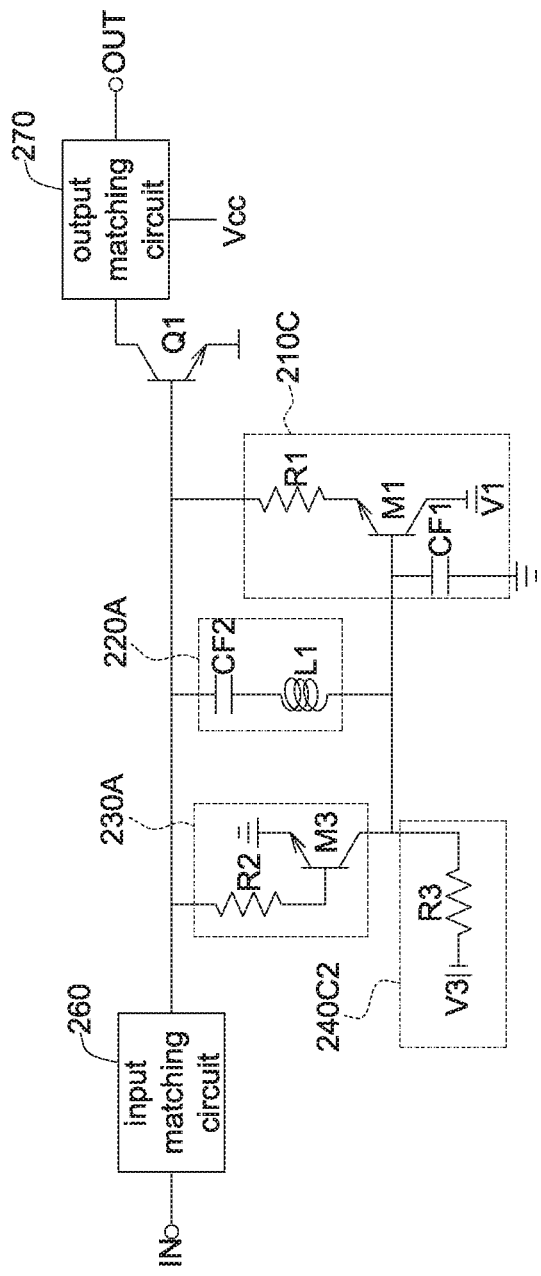

In another possible embodiment of the disclosure, the power detection circuit of the control circuit of FIG. 8A may be eliminated, as indicated in FIG. 8B. That is, in the power amplifier circuit 200C2 of FIG. 8B, the control circuit 240C2 includes a resistor R3 coupled between the control voltage V3 and the base of the transistor M1. Detailed descriptions of the operations of the embodiment in FIG. 8B may be obtained with reference to above embodiments, and are not repeated here.

Figure 9A:
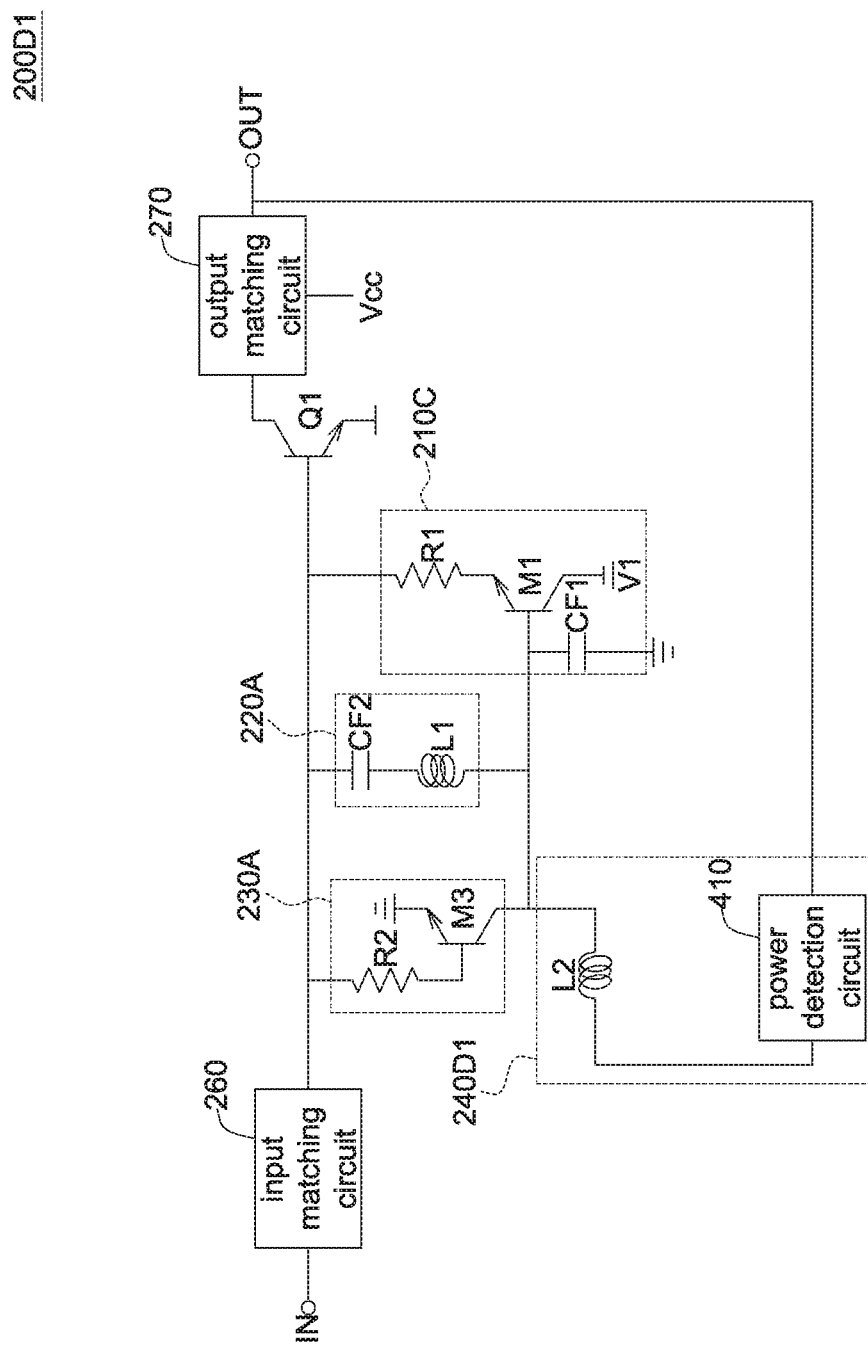
FIG. 9A and FIG. 9B are two circuit diagrams of power amplifier circuits according to two embodiments of the disclosure.

Referring to FIG. 9A, a circuit diagram of a power amplifier circuit 200D1 according to an embodiment of the disclosure is shown. As indicated in FIG. 9A, the control circuit 240D1 includes a inductor L2 (also referred as a feedback inductor) and a power detection circuit 410. The inductor L2 is coupled between the base of the transistor M1 and the power detection circuit 410. The operation of FIG. 9A is described below.

The power detection circuit 410 detects an output power of the power transistor Q1 and outputs a current to the inductor L2 to feedback control the base of the transistor M1. Detailed descriptions of the operations of other elements may be obtained with reference to above embodiments, and are not repeated here.

Figure 9B:
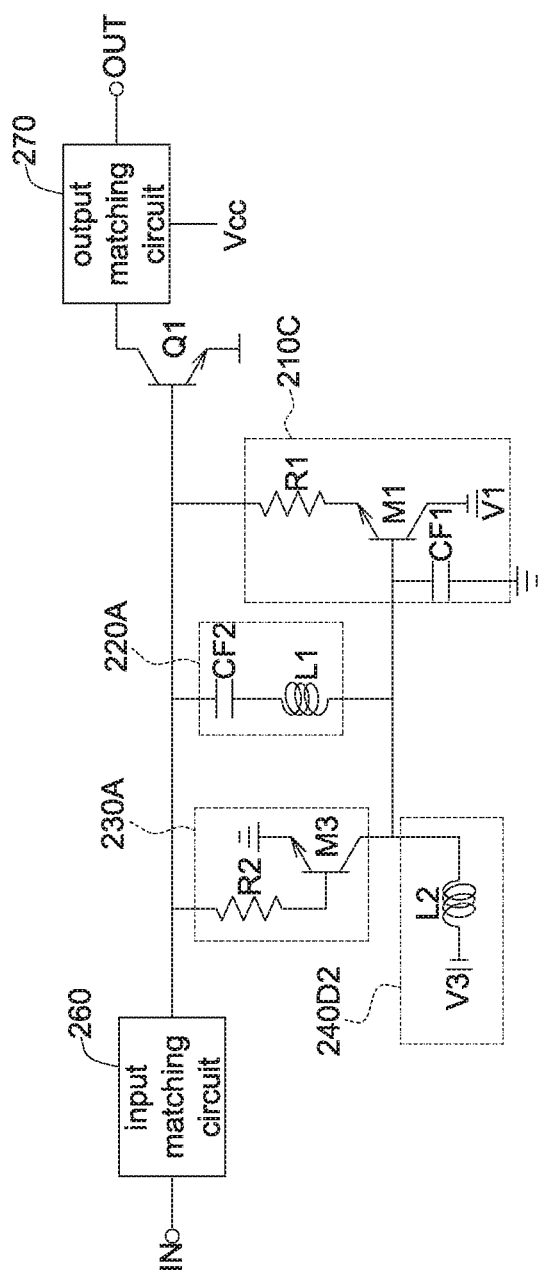

In another possible embodiment of the disclosure as indicated in FIG. 9B, the power detection circuit of the control circuit of FIG. 9A is removed. That is, in the power amplifier circuit 200D2 of FIG. 9B, the control circuit 240D2 includes an inductor L2 coupled between the control voltage V3 and the base of the transistor M1. Detailed descriptions of the operations of the embodiment of FIG. 9B may be obtained with reference to above embodiments, and are not repeated here.

Figure 10:
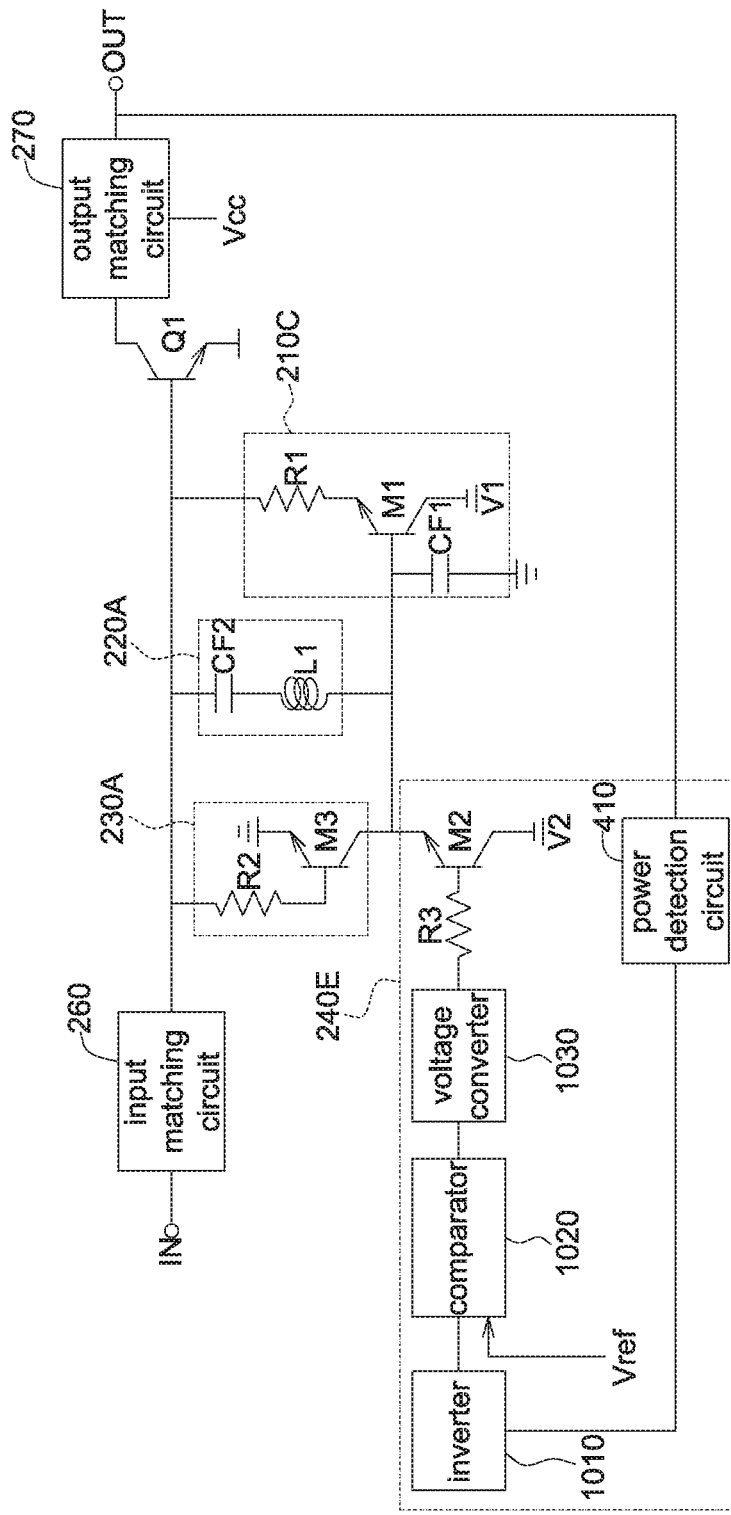
FIG. 10 is a circuit diagram of a power amplifier circuit according to an embodiment of the disclosure.

Referring to FIG. 10, a circuit diagram of a power amplifier circuit 200E according to an embodiment of the disclosure is shown. As indicated in FIG. 10, the control circuit 240E includes a resistor R3, a transistor M2, a power detection circuit 410, an inverter 1010, a comparator 1020 and a voltage converter 1030. The operation of FIG. 10 is described below.

The power detection circuit 410 is coupled to the power transistor Q1 for detecting an output power of the power transistor Q1 and outputting the detection signal to the inverter 1010. The inverter 1010 is coupled to the power detection circuit 410 for inverting and outputting the phase of the detection signal of the power detection circuit 410 to the comparator 1020. The comparator 1020 is coupled to the inverter 1010 for comparing the phase-inverted detection signal with a reference voltage Vref to obtain and output a comparison result to the voltage converter 1030. The voltage converter 1030 is coupled to the comparator 1020 and the resistor R3 for converting the comparison result into a voltage signal and for feeding the voltage signal to the base of the transistor M2 through the resistor R3, to feedback control the base current of the transistor M1.

The transistor M2 has a base coupled to the resistor R3, an emitter coupled to the second envelope detecting circuit 230A, and a collector coupled to control voltage V2.

When the input signal IN is a small signal, the power detection circuit 410 detects a small output power of the power transistor Q1 and outputs a low detection voltage signal to the inverter 1010. The inverter 1010 inverts the phase of the low detection voltage signal of the power detection circuit 410 and outputs the phase-inverted detection voltage signal to the comparator 1020. The comparator 1020 compares the phase-inverted detection voltage signal with the reference voltage Vref to output a comparison result (a low voltage signal) to the voltage converter 1030. The voltage converter 1030 converts and feeds the comparison result (the low voltage signal) to the base of the transistor M2 for controlling the switching degree of the transistor M2. When the transistor M2 is nearly turned off, the base current of the transistor M1 decreases, and a low current required by the power transistor Q1 is provided. Thus, the static current consumption of the power amplifier circuit when operated in the small power region may be decreased.

Conversely, when the input signal IN is a large signal, the power detection circuit 410 detects a large output power of the power transistor Q1 and outputs a high detection voltage signal to the inverter 1010. The inverter 1010 inverts the phase of the detection voltage signal of the power detection circuit 410 and outputs the phase-inverted detection voltage signal to the comparator 1020. The comparator 1020 compares the phase-inverted detection voltage signal with the reference voltage Vref to output a comparison result (a high voltage signal) to the voltage converter 1030. The voltage converter 1030 converts the comparison result (the high voltage signal) to feedback control the base current fed to the transistor M1. Thus, a large base current is fed to the transistor M1 to provide a large current required by the power transistor Q1, such that the linearity of the power amplifier circuit when operated in the large power region is increased.

Detailed descriptions of the operations of other elements can be obtained with reference to above embodiments, and are not repeated here.

Figure 11:
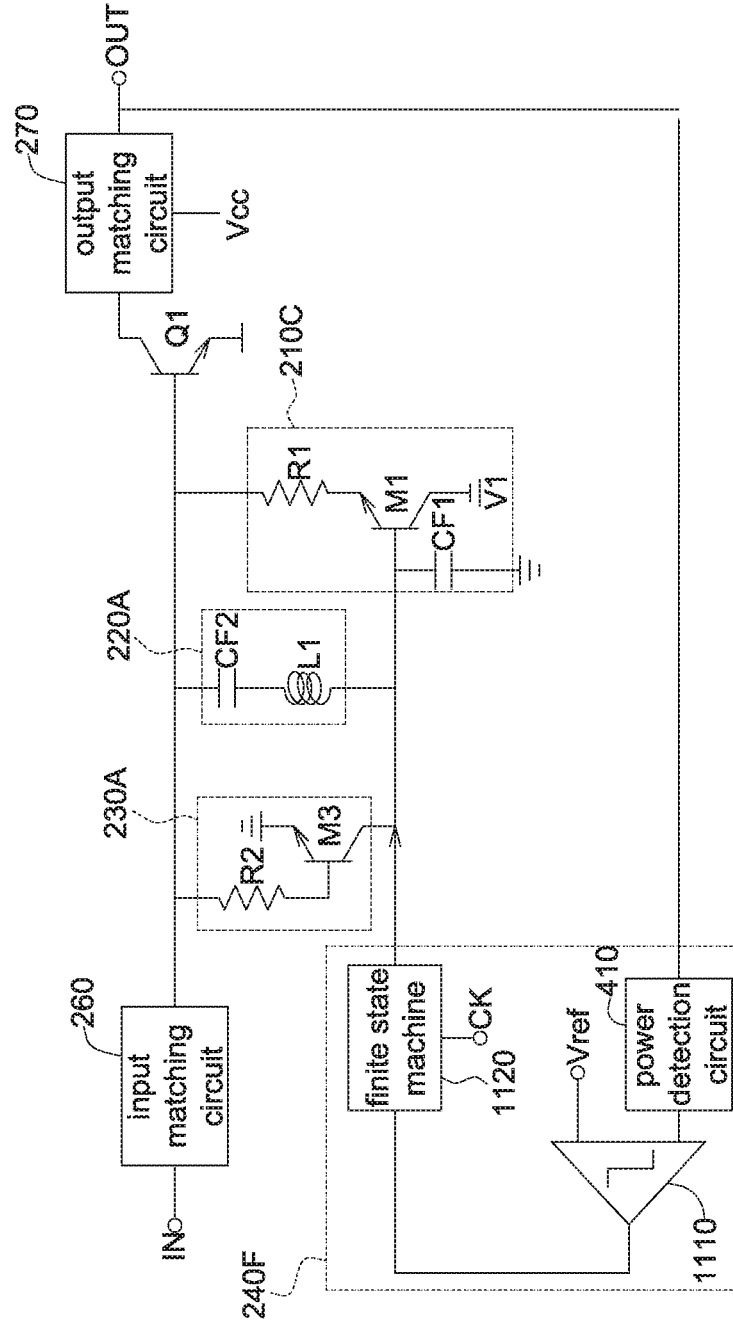
FIG. 11 is a circuit diagram of a power amplifier circuit according to an embodiment of the disclosure.

Referring to FIG. 11, a circuit diagram of a power amplifier circuit 200F according to an embodiment of the disclosure is shown. As indicated in FIG. 11, the control circuit 240F includes a power detection circuit 410, a comparator 1110 and a finite state machine (FSM) 1120. The operation of the power amplifier circuit of FIG. 11 is described below.

The power detection circuit 410 is coupled to the power transistor Q1 for detecting the output power of the power transistor Q1 and for outputting a detection signal to the comparator 1110. The comparator 1110 is coupled to the power detection circuit 410 for comparing the detection signal with the reference voltage Vref to output a comparison result to the finite state machine 1120. The finite state machine 1120 is coupled to the comparator 1110 for feedback controlling the base voltage of the transistor M1 according to the comparison result.

In detail, when the input signal IN is a small signal, the power detection circuit 410 detects the small output power of the power transistor Q1 and outputs a detection signal (such as logic low) to the comparator 1110. The comparator 1110 compares the detection signal with the reference voltage Vref to output a comparison result (such as logic high) to the finite state machine 1120. The finite state machine 1120 feedback controls the base voltage (or the base current) of the transistor M1 according to the comparison result (such as logic high) to provide a small current required by the power transistor Q1. Thus, the static current consumption of the power amplifier circuit when in the small power region may be decreased.

Conversely, when the input signal IN is a large signal, the power detection circuit 410 detects a large output power of the power transistor Q1 and outputs a detection signal (such as logic high) to the comparator 1110. The comparator 1110 compares the detection signal with the reference voltage Vref to obtain and output a comparison result (such as logic low) to the finite state machine 1120. The finite state machine 1120 feedback controls the base voltage (or the base current) of the transistor M1 according to the comparison result (such as logic low). Thus, the transistor M1 has a high base voltage for providing a large current required by the power transistor Q1, and the linearity of the power amplifier circuit when in the large power region is increased.

Detailed descriptions of the operations of other elements can be obtained with reference to above embodiments, and are not repeated here.

In other possible embodiments of the disclosure, the output of the finite state machine 1120 may have more steps, such that the base voltage or the base current of the transistor M1 may be controlled to have more steps, for achieving precise control effect.

Moreover, in the embodiments illustrated in FIG. 8A to FIG. 11, the variable impedance circuit may further include a first bypass capacitor CB1 (like FIG. 4 and FIG. 5), and such architecture is also within the spirit of the disclosure.

Figure 12:
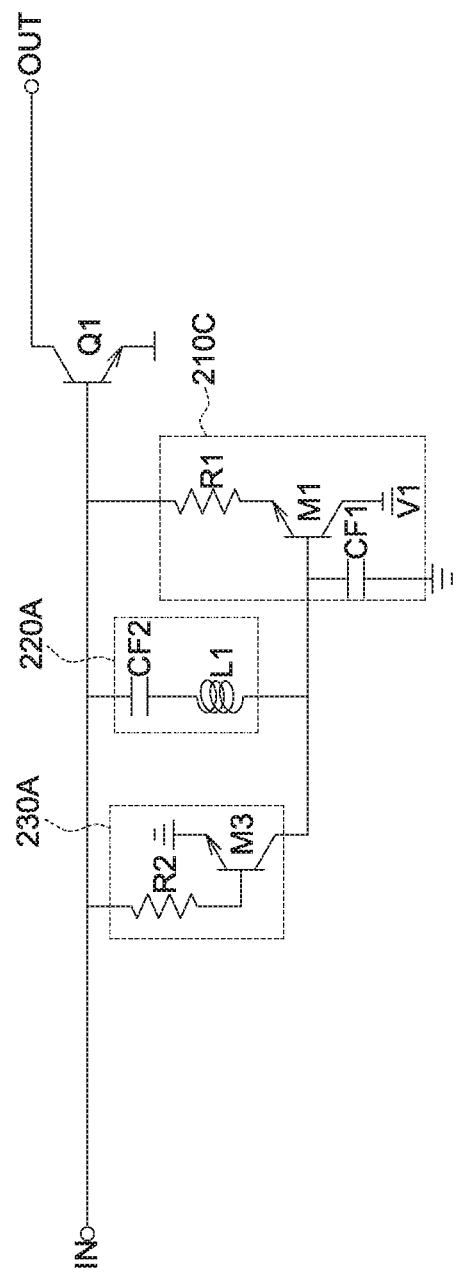
FIG. 12 is a circuit diagram of a power amplifier circuit according to an embodiment of the disclosure.

Referring to FIG. 12, a circuit diagram of a power amplifier circuit 200G according to an embodiment of the disclosure is shown. The power amplifier circuit 200G includes a power transistor Q1, a variable impedance circuit 210C, a first envelope detecting circuit 220A, and a second envelope detecting circuit 230A. The power transistor Q1 receives an input signal IN and outputs an output signal OUT. The variable impedance circuit 210C is coupled to the power transistor Q1, and includes an impedance control transistor M1, a first filter capacitor CF1 and a compensation resistor R1. The compensation resistor R1 has a first terminal coupled to the power transistor Q1 and a second terminal coupled to the first terminal of the impedance control transistor M1. The impedance control transistor M1 has a first terminal coupled to the second terminal of the compensation resistor R1, a second terminal coupled to the first filter capacitor CF1, and a third terminal receiving a first control voltage V1. The first filter capacitor CF1 is coupled between the second terminal of the impedance control transistor M1 and the ground. The operation and architecture of the variable impedance circuit 210C is obtained with reference to above descriptions. The first envelope detecting circuit 220A is coupled to the input signal IN and the variable impedance circuit 210C, and includes a second filter capacitor CF2 and a filter inductor L1. The second filter capacitor CF2 is coupled to the input signal IN. The filter inductor L1 is coupled between the second terminal of the impedance control transistor M1 and the second filter capacitor CF2. Operation and architecture of the first envelope detecting circuit 220A is obtained with reference to above descriptions. The second envelope detecting circuit 230A is coupled to the input signal IN and the variable impedance circuit 210C, and includes a protection resistor R2 and an input-signal-amplifying transistor M3. The input-signal-amplifying transistor M3 has a first terminal coupled to the ground, a second terminal coupled to the protection resistor R2, and a third terminal coupled to the second terminal of the impedance control transistor M1. The protection resistor R2 is coupled between the input signal IN and the second terminal of the input-signal-amplifying transistor M3. The operation and architecture of the second envelope detecting circuit 230A is obtained with reference to above descriptions. The power amplifier circuit 200G may selectively include an input matching circuit, an output matching circuit, a control circuit, a first bypass capacitor and/or other elements like the above embodiments. Details of the operation of the power amplifier circuit 200G are obtained with reference to above embodiments, and the details are omitted here.

Figure 13:
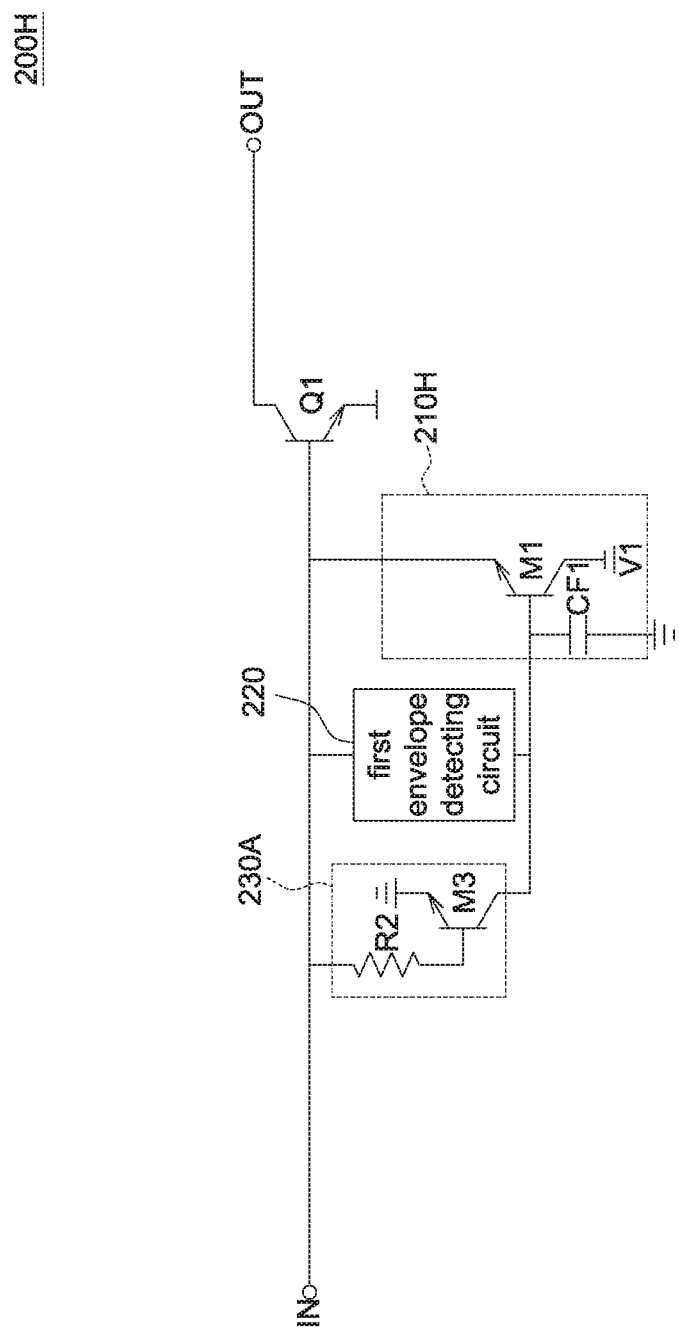
FIG. 13 is a circuit diagram of a power amplifier circuit according to an embodiment of the disclosure.

Referring to FIG. 13, a circuit diagram of a power amplifier circuit 200H according to an embodiment of the disclosure is shown. The power amplifier circuit 200H includes a power transistor Q1, a variable impedance circuit 210H, a first envelope detecting circuit 220, and a second envelope detecting circuit 230A. The power transistor Q1 receives an input signal IN and outputs an output signal OUT. The variable impedance circuit 210H is coupled to the power transistor Q1, and includes an impedance control transistor M1 and a first filter capacitor CF1. The impedance control transistor M1 has a first terminal coupled to the power transistor Q1, a second terminal of coupled to the first filter capacitor CF1, and a third terminal receiving a first control voltage V1. The first filter capacitor CF1 is coupled between the second terminal of the impedance control transistor M1 and ground. The first envelope detecting circuit 220 is coupled to the input signal IN and the variable impedance circuit 210H for detecting the input signal IN to dynamically control the equivalent impedance of the variable impedance circuit 210H. The operation and architecture of the first envelope detecting circuit 220 are obtained with reference to above descriptions. The second envelope detecting circuit 230A is coupled to the input signal IN and the variable impedance circuit 210H for detecting the input signal IN to dynamically control the equivalent impedance of the variable impedance circuit 210H. The second envelope detecting circuit 230A includes a protection resistor R2 and an input-signal-amplifying transistor M3. The input-signal-amplifying transistor M3 has a first terminal coupled to the ground, a second terminal coupled to the protection resistor R2, and a third terminal coupled to the first filter capacitor CF1 and the second terminal of the impedance control transistor M1. The protection resistor R2 is coupled between the input signal IN and the second terminal of the input-signal-amplifying transistor M3. The second envelope detecting circuit 230A amplifies and feeds the input signal IN to the second terminal of the impedance control transistor M1. The operation and architecture of the second envelope detecting circuit 230A may be obtained with reference to above descriptions. The power amplifier circuit 200H may selectively include an input matching circuit, an output matching circuit, a control circuit, a first bypass capacitor and/or other elements like the above embodiments. Details of the operation of the power amplifier circuit 200H may be obtained with reference with reference to descriptions disclosed in above embodiments, and the details are omitted here.

Figure 14:
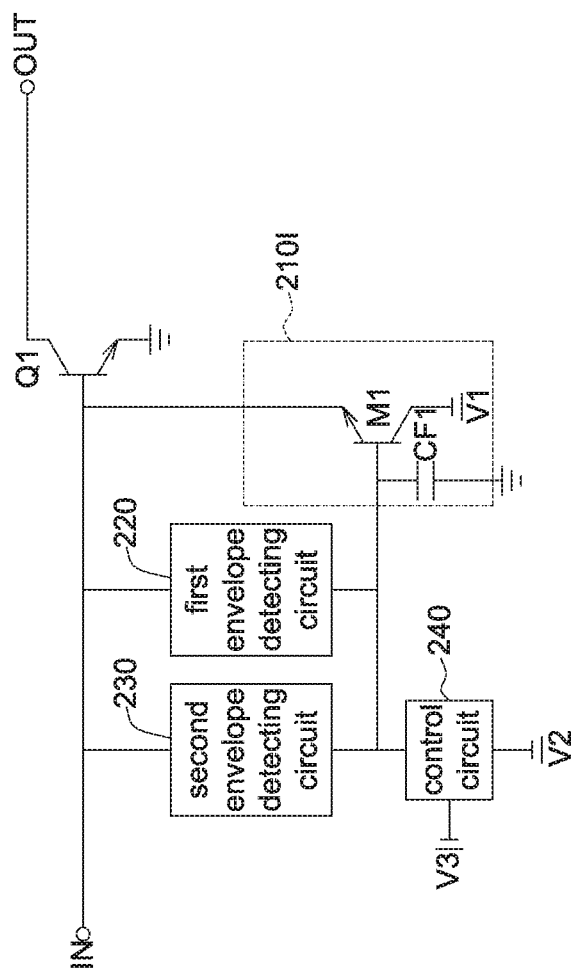
FIG. 14 is a circuit diagram of a power amplifier circuit according to an embodiment of the disclosure.

Referring to FIG. 14, a circuit diagram of a power amplifier circuit 200I according to an embodiment of the disclosure is shown. The power amplifier circuit 200I includes a power transistor Q1, a variable impedance circuit 210I, a first envelope detecting circuit 220, a second envelope detecting circuit 230, and a control circuit 240. The power transistor Q1 receives an input signal IN and outputs an output signal OUT. The operation and architecture of the variable impedance circuit 210I may be the same or similar with that of the variable impedance circuit 210H. The first envelope detecting circuit 220 is coupled to the input signal IN and the variable impedance circuit 210I for detecting the input signal IN to dynamically control the equivalent impedance of the variable impedance circuit 210I. The second envelope detecting circuit 230 is coupled to the input signal IN and the variable impedance circuit 210I for detecting the input signal IN to dynamically control the equivalent impedance of the variable impedance circuit 210I. The control circuit 240 is coupled to the variable impedance circuit 210I for controlling the variable impedance circuit 210I to provide a current to the power transistor Q1. The power amplifier circuit 200H may selectively include an input matching circuit, an output matching circuit, a first bypass capacitor and/or other elements like the above embodiments like the above embodiments. Details of the operation of the power amplifier circuit 200I may be obtained with reference to above embodiments, and the details are omitted here.

From the above description, the power amplifier circuits according to the above embodiments of the disclosure may improve the efficiency and linearity of the power transistor.

The power amplifier circuits according to the above embodiments of the disclosure may reduce the static current consumption of the power transistor when operated in a low power region.

The power amplifier circuits according to the above embodiments of the disclosure may suppress third-order distorted signals, and avoid the communication quality of signals from being deteriorated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power amplifier circuit, comprising:
a power transistor, receiving an input signal and outputting an output signal;
a variable impedance circuit coupled to the power transistor and comprising an impedance control transistor, a first filter capacitor and a compensation resistor, wherein the compensation resistor has a first terminal coupled to the power transistor and a second terminal coupled to a first terminal of the impedance control transistor, the impedance control transistor has the first terminal coupled to the second terminal of the compensation resistor, a second terminal coupled to the first filter capacitor, and a third terminal receiving a first control voltage, the first filter capacitor is coupled between the second terminal of the impedance control transistor and a ground;
a first envelope detecting circuit coupled to the input signal and the variable impedance circuit, the first envelope detecting circuit comprising a second filter capacitor coupled to the input signal and a filter inductor coupled between the second terminal of the impedance control transistor and the second filter capacitor; and
a second envelope detecting circuit coupled to the input signal and the variable impedance circuit, comprising a protection resistor and an input-signal-amplifying transistor, wherein the input-signal-amplifying transistor has a first terminal coupled to the ground, a second terminal coupled to the protection resistor, and a third terminal coupled to the second terminal of the impedance control transistor, the protection resistor is coupled between the input signal and the second terminal of the input-signal-amplifying transistor.

2. The power amplifier circuit according to claim 1, wherein, the variable impedance circuit further comprises a first bypass capacitor coupled between the third terminal of the impedance control transistor and the ground, the power amplifier circuit further comprises a control circuit, coupled to the variable impedance circuit, the control circuit comprising:
a feedback control transistor having a first terminal coupled to the second terminal of the impedance control transistor, a second terminal, and a third terminal coupled to a second control voltage;
a second bypass capacitor coupled between the third terminal of the feedback control transistor and the ground;
a third bypass capacitor coupled between the second terminal of the feedback control transistor and the ground;
a feedback resistor coupled to the second terminal of the feedback control transistor; and
a power detection circuit coupled between the power transistor and the feedback resistor, detecting an output power of the output signal of the power transistor.

3. The power amplifier circuit according to claim 1, wherein, the variable impedance circuit further comprises a first bypass capacitor coupled between the third terminal of the impedance control transistor and the ground, the power amplifier circuit further comprises a control circuit, coupled to the variable impedance circuit, the control circuit comprising:
a feedback control transistor having a first terminal coupled to the second terminal of the impedance control transistor, a second terminal, and a third terminal coupled to a second control voltage;
a second bypass capacitor coupled between the third terminal of the feedback control transistor and the ground;
a third bypass capacitor coupled between the second terminal of the feedback control transistor and the ground; and
a feedback resistor coupled between the second terminal of the feedback control transistor and a third control voltage.

4. The power amplifier circuit according to claim 1, further comprising:
a control circuit, coupled to the variable impedance circuit, the control circuit comprising:
a feedback resistor coupled to the second terminal of the impedance control transistor; and
a power detection circuit, coupled between the power transistor and the feedback resistor, detecting an output power of the output signal of the power transistor.

5. The power amplifier circuit according to claim 1, further comprising:
a control circuit, coupled to the variable impedance circuit, the control circuit comprising a feedback resistor coupled between the second terminal of the impedance control transistor and a third control voltage.

6. The power amplifier circuit according to claim 1, further comprising:
a control circuit, coupled to the variable impedance circuit, the control circuit comprising:
a feedback inductor coupled to the second terminal of the impedance control transistor; and
a power detection circuit, coupled between the power transistor and the feedback inductor, detecting an output power of the output signal of the power transistor.

7. The power amplifier circuit according to claim 1, further comprising:
a control circuit, coupled to the variable impedance circuit, the control circuit comprising:
a feedback inductor coupled between the second terminal of the impedance control transistor and a third control voltage.

8. The power amplifier circuit according to claim 1, further comprising:
a control circuit, coupled to the variable impedance circuit, the control circuit comprising:
a power detection circuit, coupled to the power transistor, detecting an output power of the output signal of the power transistor to output a detection voltage signal;
an inverter, coupled to the power detection circuit, inverting the detection voltage signal of the power detection circuit to a phase-inverted detection voltage signal;
a comparator, coupled to the inverter, comparing the phase-inverted detection voltage signal with a reference voltage to obtain a comparison result;
a voltage converter, coupled to the comparator, converting the comparison result into a converted signal;
a feedback resistor coupled to the voltage converter; and
a feedback control transistor having a first terminal coupled to the second envelope detecting circuit, a second terminal coupled to the feedback resistor, and a third terminal coupled to a second control voltage, wherein the converted signal is fed to the second terminal of the feedback control transistor through the feedback resistor.

9. The power amplifier circuit according to claim 1, further comprising:
an input matching circuit, coupled to the power transistor, matching an input impedance with the input signal; and
an output matching circuit, coupled to the power transistor, matching an output impedance with the output signal.

10. A power amplifier circuit, comprising:
a power transistor receiving an input signal and outputting an output signal;
a variable impedance circuit coupled to the power transistor and comprising an impedance control transistor and a first filter capacitor, wherein an equivalent impedance of the variable impedance circuit varies with the input signal, the impedance control transistor has a first terminal coupled to the power transistor, a second terminal coupled to the first filter capacitor, and a third terminal receiving a first control voltage, and the first filter capacitor is coupled between the second terminal of the impedance control transistor and a ground;
a first envelope detecting circuit, coupled to the input signal and the variable impedance circuit, detecting the input signal to dynamically control the equivalent impedance of the variable impedance circuit; and
a second envelope detecting circuit, coupled to the input signal and the variable impedance circuit, detecting the input signal to dynamically control the equivalent impedance of the variable impedance circuit, the second envelope detecting circuit comprising a protection resistor and an input-signal-amplifying transistor, wherein the input-signal-amplifying transistor has a first terminal coupled to the ground, a second terminal coupled to the protection resistor, and a third terminal coupled to the first filter capacitor and the second terminal of the impedance control transistor, the protection resistor is coupled between the input signal and the second terminal of the input-signal-amplifying transistor, the second envelope detecting circuit amplifies and feeds the input signal into the second terminal of the impedance control transistor.

11. The power amplifier circuit according to claim 10, further comprising:
a control circuit, coupled to the variable impedance circuit, controlling the variable impedance circuit to provide a current to the power transistor.

12. The power amplifier circuit according to claim 10, wherein, the variable impedance circuit further comprises:
a compensation resistor coupled between the power transistor and the first terminal of the impedance control transistor; and
a first bypass capacitor coupled between the third terminal of the impedance control transistor and the ground.

13. The power amplifier circuit according to claim 10, wherein,
the first envelope detecting circuit comprises:
a second filter capacitor coupled to the input signal; and
a filter inductor coupled between the second terminal of the impedance control transistor and the second filter capacitor.

14. The power amplifier circuit according to claim 10, further comprising:
an input matching circuit, coupled to the power transistor, matching an input impedance with the input signal; and
an output matching circuit, coupled to the power transistor, matching an output impedance with the output signal.

15. A power amplifier circuit, comprising:
a power transistor receiving an input signal and outputting an output signal;
a variable impedance circuit, coupled to the power transistor, the variable impedance circuit comprising an impedance control transistor and a first filter capacitor, wherein an equivalent impedance of the variable impedance circuit varies with the input signal, the impedance control transistor has a first terminal coupled to the power transistor, a second terminal coupled to the first filter capacitor, and a third terminal receiving a first control voltage, the first filter capacitor is coupled between the second terminal of the impedance control transistor and a ground;
a first envelope detecting circuit, coupled to the input signal and the variable impedance circuit, detecting the input signal to dynamically control the equivalent impedance of the variable impedance circuit, the first envelope detecting circuit comprising a filter unit, fetching and providing the input signal to the second terminal of the impedance control transistor of the variable impedance circuit;
a second envelope detecting circuit, coupled to the input signal and the variable impedance circuit, detecting the input signal to dynamically control the equivalent impedance of the variable impedance circuit, the second envelope detecting circuit amplifying and feeding the input signal into the second terminal of the impedance control transistor; and
a control circuit, coupled to the variable impedance circuit, controlling the variable impedance circuit to provide a current to the power transistor.

16. The power amplifier circuit according to claim 15, wherein, the variable impedance circuit further comprises a first bypass capacitor coupled between the third terminal of the impedance control transistor and the ground,
the power amplifier circuit further comprises a control circuit, coupled to the variable impedance circuit, the control circuit comprising:
a feedback control transistor having a first terminal coupled to the second terminal of the impedance control transistor, a second terminal, and a third terminal coupled to a second control voltage;
a second bypass capacitor coupled between the third terminal of the feedback control transistor and the ground;
a third bypass capacitor coupled between the second terminal of the feedback control transistor and the ground;
a feedback resistor coupled to the second terminal of the feedback control transistor; and
a power detection circuit, coupled between the power transistor and the feedback resistor, detecting an output power of the power transistor.

17. The power amplifier circuit according to claim 15, wherein, the variable impedance circuit further comprises a first bypass capacitor coupled between the third terminal of the impedance control transistor and the ground,
the power amplifier circuit further comprises a control circuit, coupled to the variable impedance circuit, the control circuit comprising:
a feedback control transistor having a first terminal coupled to the second terminal of the impedance control transistor, a second terminal, and a third terminal coupled to a second control voltage;
a second bypass capacitor coupled between the third terminal of the feedback control transistor and the ground;
a third bypass capacitor coupled between the second terminal of the feedback control transistor and the ground; and
a feedback resistor coupled between the second terminal of the feedback control transistor and a third control voltage.

18. The power amplifier circuit according to claim 15, further comprising:
a control circuit, coupled to the variable impedance circuit, the control circuit comprising:
a feedback resistor coupled to the second terminal of the impedance control transistor; and
a power detection circuit, coupled between the power transistor and the feedback resistor, detecting an output power of the power transistor.

19. The power amplifier circuit according to claim 15, further comprising:
a control circuit, coupled to the variable impedance circuit, the control circuit comprising a feedback resistor coupled between the second terminal of the impedance control transistor and a third control voltage.

20. The power amplifier circuit according to claim 15, further comprising:
a control circuit, coupled to the variable impedance circuit, the control circuit comprising:
a feedback inductor coupled to the second terminal of the impedance control transistor; and a power detection circuit, coupled between the power transistor and the feedback inductor, detecting an output power of the power transistor.

21. The power amplifier circuit according to claim 15, further comprising:
a control circuit, coupled to the variable impedance circuit, the control circuit comprising:
a feedback inductor coupled between the second terminal of the impedance control transistor and a third control voltage.

22. The power amplifier circuit according to claim 15, further comprising:
a control circuit, coupled to the variable impedance circuit, the control circuit comprising:
a power detection circuit, coupled to the power transistor, detecting an output power of the power transistor to output a detection voltage signal;
an inverter, coupled to the power detection circuit, inverting the detection voltage signal of the power detection circuit to a phase-inverted detection voltage signal;
a comparator, coupled to the inverter, comparing the phase-inverted detection voltage signal with a reference voltage to obtain a comparison result;
a voltage converter, coupled to the comparator, converting the comparison result into a converted signal;
a feedback resistor coupled to the voltage converter; and
a feedback control transistor having a first terminal coupled to the second envelope detecting circuit, a second terminal coupled to the feedback resistor, and a third terminal coupled to a second control voltage, wherein the converted signal is fed to the second terminal of the feedback control transistor through the feedback resistor.

23. The power amplifier circuit according to claim 15, wherein, the second envelope detecting circuit comprises a protection resistor and an input-signal-amplifying transistor, the input-signal-amplifying transistor has a first terminal coupled to the ground, a second terminal coupled to the protection resistor, and a third terminal coupled to the first filter capacitor and the second terminal of the impedance control transistor, the protection resistor is coupled between the input signal and the second terminal of the input-signal-amplifying transistor.

\* \* \* \* \*